(12) United States Patent
Tsai et al.

(10) Patent No.: US 7,936,067 B2
(45) Date of Patent: May 3, 2011

(54) BACKEND INTERCONNECT SCHEME WITH MIDDLE DIELECTRIC LAYER HAVING IMPROVED STRENGTH

(75) Inventors: Hao-Yi Tsai, Hsin-Chu (TW); Yu-Wen Liu, Taipei (TW); Hsien-Wei Chen, Sinying (TW); Ying-Ju Chen, Tuku (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 352 days.

(21) Appl. No.: 12/121,541

(22) Filed: May 15, 2008

(65) Prior Publication Data

US 2009/0283911 A1  Nov. 19, 2009

(51) Int. Cl.
*H01L 23/48*  (2006.01)
*H01L 23/52*  (2006.01)
*H01L 29/40*  (2006.01)

(52) U.S. Cl. ...................................................... 257/758

(58) Field of Classification Search ................... 257/750, 257/758, E23.142, E21.576
See application file for complete search history.

(56) References Cited

U.S. PATENT DOCUMENTS

| | | | |
|---|---|---|---|
| 7,592,710 B2 * | 9/2009 | Hsia et al. | 257/786 |
| 2003/0218259 A1 * | 11/2003 | Chesire et al. | 257/786 |
| 2004/0251549 A1 * | 12/2004 | Huang et al. | 257/758 |
| 2007/0120256 A1 * | 5/2007 | Chen | 257/758 |

* cited by examiner

*Primary Examiner* — Phuc T Dang
(74) *Attorney, Agent, or Firm* — Slater & Matsil, L.L.P.

(57) ABSTRACT

An integrated circuit structure includes a first, a second and a third metallization layer. The first metallization layer includes a first dielectric layer having a first k value; and first metal lines in the first dielectric layer. The second metallization layer is over the first metallization layer, and includes a second dielectric layer having a second k value greater than the first k value; and second metal lines in the second dielectric layer. The third metallization layer is over the second metallization layer, and includes a third dielectric layer having a third k value; and third metal lines in the third dielectric layer. The integrated circuit structure further includes a bottom passivation layer over the third metallization layer.

13 Claims, 4 Drawing Sheets

BACKEND INTERCONNECT SCHEME WITH MIDDLE DIELECTRIC LAYER HAVING IMPROVED STRENGTH

TECHNICAL FIELD

This invention relates generally to integrated circuits, and more particularly to the backend interconnect structures, and even more particularly to improving the reliability and performance of the interconnect structures.

BACKGROUND

As the semiconductor industry introduces new generations of integrated circuits (IC's) having higher performance and greater functionality, the density of the elements that form the integrated circuits is increased, and the dimensions, sizes and spacings between the individual components or elements are reduced. While in the past such reductions were limited only by the ability to define the structures photo-lithographically, device geometries having even smaller dimensions created new limiting factors. For example, for any two adjacent conductive paths, as the distance between the conductors decreases, the resulting capacitance (a function of the dielectric constant (k value) of the insulating material divided by the distance between conductive paths) increases. This increased capacitance results in increased capacitive coupling between the conductors, increased power consumption, and an increase in the resistive-capacitive (RC) time constant. Therefore, continual improvement in semiconductor IC performance and functionality is dependent upon developing materials that form a dielectric film with a lower dielectric constant (k) than that of the most commonly used material, silicon oxide, in order to reduce capacitance.

New materials with extra low-k (ELK) dielectric constants and ultra low-k (XLK) dielectric materials are being investigated for use as insulators in semiconductor chip designs. A low dielectric constant material helps to enable further reductions in the integrated circuit feature dimensions. In conventional IC processing, silicon oxide was used as a basis for the dielectric material, resulting in a dielectric constant of about 3.9. Advanced low-k dielectric materials have dielectric constants below about 2.5, and may even be below about 2.0.

The substance with the lowest dielectric constant is air (with a k value of 1.0). Therefore, porous dielectrics are very promising candidates, since they have the potential to provide very low dielectric constants. However, porous films are mechanically weak by nature, and weak films may fail in the chemical mechanical polishing (CMP) processes employed to planarize the wafer surface during chip manufacturing. Further, the weak low-k dielectric materials cause difficulties in the packaging processes. For example, in wire-bonding processes, the force applied for detaching wires also causes the low-k dielectric materials underlying the bond pads to peel off.

With the use of dielectric constants having increasingly smaller dielectric constants, the dielectric peel-off becomes a significant factor affecting the yield of manufacturing of the integrated circuits, new methods are thus needed to improve the yield without affecting the electrical performance of integrated circuits.

SUMMARY OF THE INVENTION

In accordance with one aspect of the present invention, an integrated circuit structure includes a first, a second and a third metallization layer. The first metallization layer includes a first dielectric layer having a first k value; and first metal lines in the first dielectric layer. The second metallization layer is over the first metallization layer, and includes a second dielectric layer having a second k value greater than the first k value; and second metal lines in the second dielectric layer. The third metallization layer is over the second metallization layer, and includes a third dielectric layer having a third k value; and third metal lines in the third dielectric layer. The integrated circuit structure further includes a bottom passivation layer over the third metallization layer.

In accordance with another aspect of the present invention, an integrated circuit structure includes a semiconductor substrate; a passivation layer over the semiconductor substrate; and an interconnect structure between the semiconductor substrate and the passivation layer. The interconnect structure includes a plurality of metallization layers, each having a dielectric layer, and metal lines in the dielectric layer. The dielectric layers in the plurality of metallization layers include a first group of dielectric layers having first k values; a second group of dielectric layers over the first group of dielectric layers and having second k values; and a third group of dielectric layers over the second group of dielectric layers and having third k values. The second k values are different from the k values.

In accordance with yet another aspect of the present invention, an integrated circuit structure includes a semiconductor substrate; and an interconnect structure overlying the semiconductor substrate. The interconnect structure includes at least about seven metallization layers, which includes a first metallization layer, a second metallization layer over the first metallization layer, and a third metallization layer over the second metallization layer. The first metallization layer includes a first dielectric layer having a first k value; and first metal lines in the first dielectric layer. The second metallization layer is in a middle position of the interconnect structure, and includes a second dielectric layer having a second k value, wherein the second dielectric layer has a greater mechanical strength than the first dielectric layer; and second metal lines in the second dielectric layer. The third metallization layer includes a third dielectric layer having a third k value; and third metal lines in the third dielectric layer.

An advantageous feature of the present invention is improved mechanical strength, and hence reliability, of semiconductor chips.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel interconnect structure with improved reliability and the method of forming the same are provided. Throughout the various views and illustrative embodiments of the present invention, like reference numbers are used to designate like elements.

Figure 1:
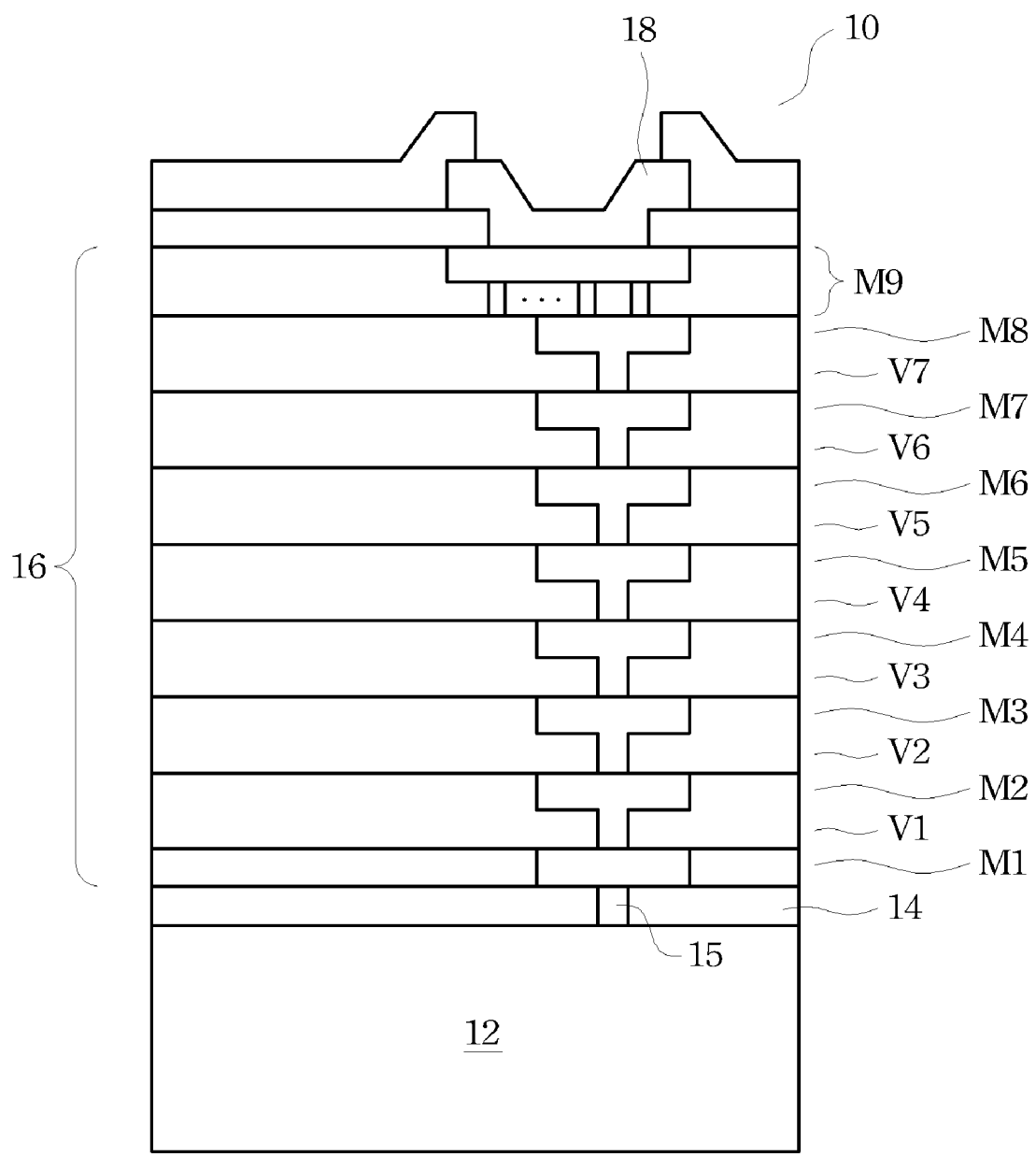
FIG. 1 illustrates an interconnect structure having a plurality of metallization layers.

FIG. 1 illustrates an embodiment of the present invention. Semiconductor chip 10 includes semiconductor substrate 12, on which integrated circuit devices (not shown), such as transistors, capacitors, resistors, and the like, are formed. Semiconductor substrate 12 may be formed of silicon, silicon germanium, or other commonly used semiconductor materials. Inter-dielectric layer (ILD) 14 is formed over semiconductor substrate 12. A contact etch stop layer (not shown) may be formed underlying ILD 14, but over the integrated circuit devices. Contact(s) 15 is formed in ILD 14, and is used to connect the integrated circuit devices and the interconnect structure overlying ILD 14.

Interconnect structure 16 is formed over ILD 14. Preferably, interconnect structure 16 includes a plurality of metallization layers, each including a dielectric layer, and metal lines and metal pads formed in the dielectric layer. From bottom to top, the metallization layers are referred to as metallization layer 1 (Ml), metallization layer 2 (M2), . . . , and the like. The top metallization layer (for example, metallization layer M9 in FIG. 1) may also be referred to as metallization layer Mtop. Bond pads, for example, bond pad 18, are formed on the surface of semiconductor chip 10, and are electrically connected to, the top metallization layer Mtop. Metallization layers M1 through Mtop are used to interconnect integrated circuits, and to connect the integrated circuits to the bond pads. In the embodiments of the present invention, interconnect structure 16 includes at least three, and up to nine, or even more, metallization layers. Throughout the description, an exemplary interconnect structure including nine metallization layers is described to explain the concept of the present invention.

Metallization layers M1 through Mtop are interconnected using vias, which are in layers referred to as V1, V2 . . . and the like. Metallization layer M1 may be formed using a single-damascene process, while metallization layers M2 through M9 may be formed using dual-damascene processes, in which metal lines are formed along with the underlying vias.

With a plurality of metallization layers, there exists a middle metallization layer in a middle portion of interconnect structure 16. In the preferred embodiment, if metallization layer Mtop is an oddly numbered layer, the middle metallization layer is the layer having a layer number (top/2+1), wherein the number "top" indicates the numeral order of the top metallization layer. If the number "top" is an even number, the middle metallization layer is preferably the layer having the layer number (top/2+1), or alternatively, the layer having the layer number (top/2−1). In the case the total number of the metallization layers is great enough, for example, greater than about 7, the middle metallization layer(s) may also be (or include) a metallization layer immediately over, and/or immediately under, the above-discussed middle metallization layer. There is at least one, preferably more, metallization layer overlying and underlying the middle metallization layer(s). For simplicity of the discussion, the dielectric layer in the middle metallization layer is referred to as a middle dielectric layer, the dielectric layers overlying the middle metallization layer are referred to as upper dielectric layers, and the dielectric layers underlying the middle metallization layer are referred to as lower dielectric layers. The dielectric layers in the metallization layers may also be referred to using the reference numerals of the corresponding metallization layers, and hence are referred to as dielectric layer 1, dielectric layer 2 . . . , and the like.

In the preferred embodiment, the middle dielectric layer is formed using a mechanically strong dielectric material. At least one of the lower dielectric layers includes a dielectric material mechanically weaker than the middle dielectric layer. Since dielectric materials with lower k values are typically mechanically weaker, the middle dielectric layer accordingly preferably has a higher k value than that of the lower dielectric layers. The k value of the middle dielectric layer is also preferably greater than the k values of the lower dielectric layers by greater than about 10%, and more preferably greater than about 12%, and even more preferably between about 40% and about 60%. Mechanical property wise, the mechanical strength/hardness of the middle dielectric layer is preferably greater than the mechanical strength of the lower dielectric layers by greater than about 4 MPa, and more preferably greater than about 70 MPa, and even more preferably between about 70 MPa and about 80 MPa. In an exemplary embodiment, the mechanical strength of the middle dielectric layer is between about 70 MPa and about 80 MPa, and the mechanical strengths of the lower dielectric layers are between about 10 MPa and about 14 MPa. In alternative embodiments, the middle dielectric layer has a k value equal to, or substantially close to, the k value of the lower dielectric layers. However, the mechanical strength of the middle dielectric layer is greater than that of the lower dielectric layers. This may be achieved using different curing or treatment methods.

In the case where the middle dielectric layer is in metallization layer M5, dielectric layers 2, 3, and 4 preferably have lower k values than the middle dielectric layer 5. Alternatively, dielectric layer 5, and one or both of dielectric layers 4 and 6, are considered as the middle dielectric layer, and thus have higher k values (and higher mechanical strengths) than the dielectric layers 2, 3, and possibly 4 (if dielectric layer 4 is not a part of the middle dielectric layer).

In an embodiment, dielectric layer 1 may have a higher k value than that of dielectric layers 2, 3, and 4. In alternative embodiments, dielectric layer 1 has a k value substantially close to (or the same as) that of dielectric layers 2, 3, and 4. The upper dielectric layers 6, 7, and 8 may have k values substantially close to (or equal to), or lower than, that of the middle dielectric layer 5. The top dielectric layer, for example, dielectric layer 9, may be a passivation layer, and may be formed using a dielectric material having a higher k value, and a greater mechanical strength, than the underlying dielectric layers 1 through 8. In an exemplary embodiment, dielectric layer 9 is formed using un-doped silicate glass (USG). In alternative embodiments, dielectric layer 9 includes a silicon nitride layer over a silicon oxide layer. In the case where there is more than one passivation layer, dielectric layer 9 is the bottom passivation layer among all passivation layers.

Using the teaching provided in the preceding paragraphs, various embodiments can be made. In an embodiment, the lower dielectric layers, for example, dielectric layers 2, 3, and 4, are formed of ultra low-k (XLK) dielectric materials, for example, with k values lower than about 2.0. The middle dielectric layer(s) is formed of extra low-k (ELK) dielectric materials, for example, with k values between about 2.0 and about 2.5. The middle dielectric layer(s) may also be formed of dielectric materials having greater values, for example, low-k dielectric materials with exemplary k values between about 2.5 and 3.9, or even materials with k values greater than about 3.9. An exemplary material for the middle dielectric layer(s) is USG. The upper dielectric layers 6, 7, and 8 are preferably formed of ELK dielectric materials, although they can also be formed of XLK dielectric materials. Dielectric layer 1, and possibly dielectric layer 2, may be formed of either ELK dielectric materials or XLK dielectric materials.

In other embodiments, the lower dielectric layers, for example, dielectric layers 2, 3, and 4, are formed of ELK dielectric materials. Accordingly, the middle dielectric layer(s) is formed of either low-k dielectric materials with exemplary k values between about 2.5 and about 3.9, or materials with k values greater than about 3.9. The upper dielectric layers 6, 7, and 8 are preferably formed of low-k dielectric materials, although they can also be formed of ELK or low-k dielectric materials, or even dielectric materials with k values greater than about 3.9. Dielectric layer 1, and possibly dielectric layer 2, may be formed of either ELK dielectric materials or low-k dielectric materials. Possibly, if the density of metal lines in the dielectric layer 2 is low, dielectric layer 2 may also be formed of a dielectric material having a higher k value than that of dielectric layer 3.

If the mechanical strengths (or k values) of the lower dielectric layers, such as dielectric layers 2, 3, and possibly 4, in low-k regime, the mechanical strength (or k values) of the middle dielectric layer needs to be increased accordingly. Please note in the above-discussed embodiments, the preferred differences in k values may also be applied to the differences in the mechanical strengths of the dielectric materials. Accordingly, XLK materials correspond to first mechanical strengths, ELK materials correspond to second mechanical strengths greater than the first mechanical strengths, and low-k materials correspond to third mechanical strengths greater than the second mechanical strengths, etc.

In the above-discussed embodiments, the k values of the dielectric layer (referred to as via dielectric layers hereinafter), in which vias are formed, are preferably the same as the immediate overlying dielectric layer in which the metal lines are formed. More preferably, the dielectric materials of the via dielectric layers are the same as the immediate overlying dielectric layer. Alternatively, the k values of the via dielectric layers are the same as the immediate underlying dielectric layers.

Figure 2:
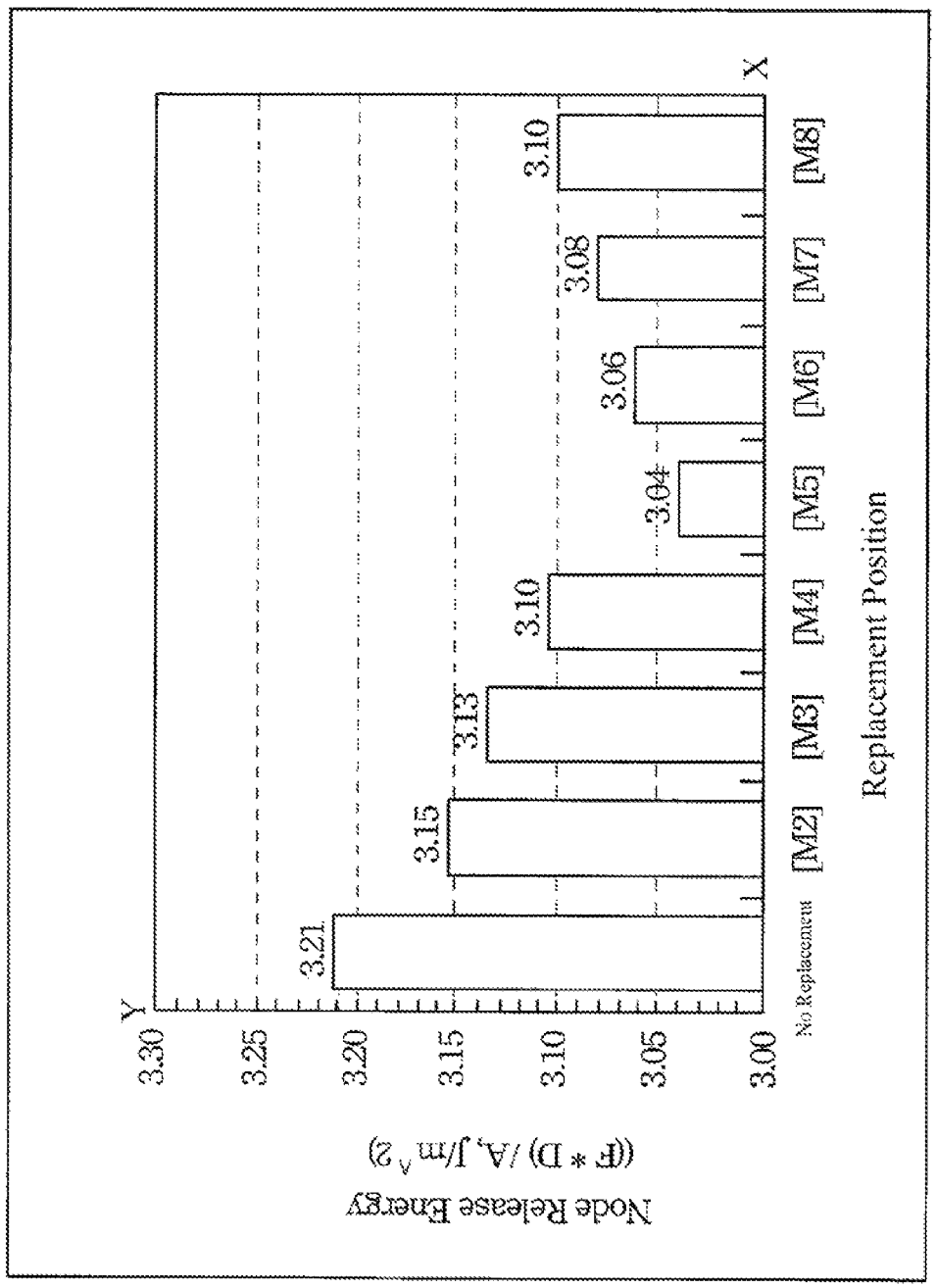
FIG. 2 illustrates the node release energies as a function of the positions, at which a dielectric layer is replaced with another dielectric layer having a higher k value.

Forming a mechanically strong middle dielectric layer advantageously increases the mechanical strength of the entire semiconductor chip 10 (refer to FIG. 1). Particularly, when a wire-bonding is performed, to detach the wire from bond pad 18, a force is asserted to pull the wire away from bond pad 18. The force is also conducted to the underlying metallization layers M1 through Mtop. Simulations were made to study the node release energy (NRE) at bond pad 18, which is equal to the force applied to bond pad 18 times the displacement of bond pad 18. Greater node release energies indicate greater displacements to bond pad 18, and hence greater possibility of peeling. The peeling may occur between any two dielectric layers, as will be discussed in detail in subsequent paragraphs. In each of the simulations, only one of the dielectric layers was replaced with a USG layer, while the remaining dielectric layers were not replaced. The results are illustrated in FIG. 2, wherein the Y-axis indicates the node release energy, and the X-axis indicate the dielectric layer replaced with the USG layer. The simulation results have revealed the position of the replacement significantly affects the node release energy. If no replacement is made, the node release energy has a value of 3.21. The replacement at any position will desirably reduce the node release energy. The optimum replacement position is around the middle dielectric layer, particularly dielectric layer M5, at which the node release energy is reduced to about 3.04. Smaller node release energies indicate smaller displacement, and hence smaller possibility of peeling. The results shown in FIG. 2 hence indicate that using stronger dielectric materials in the middle dielectric layer has the best effect of reducing peeling.

Figure 3:
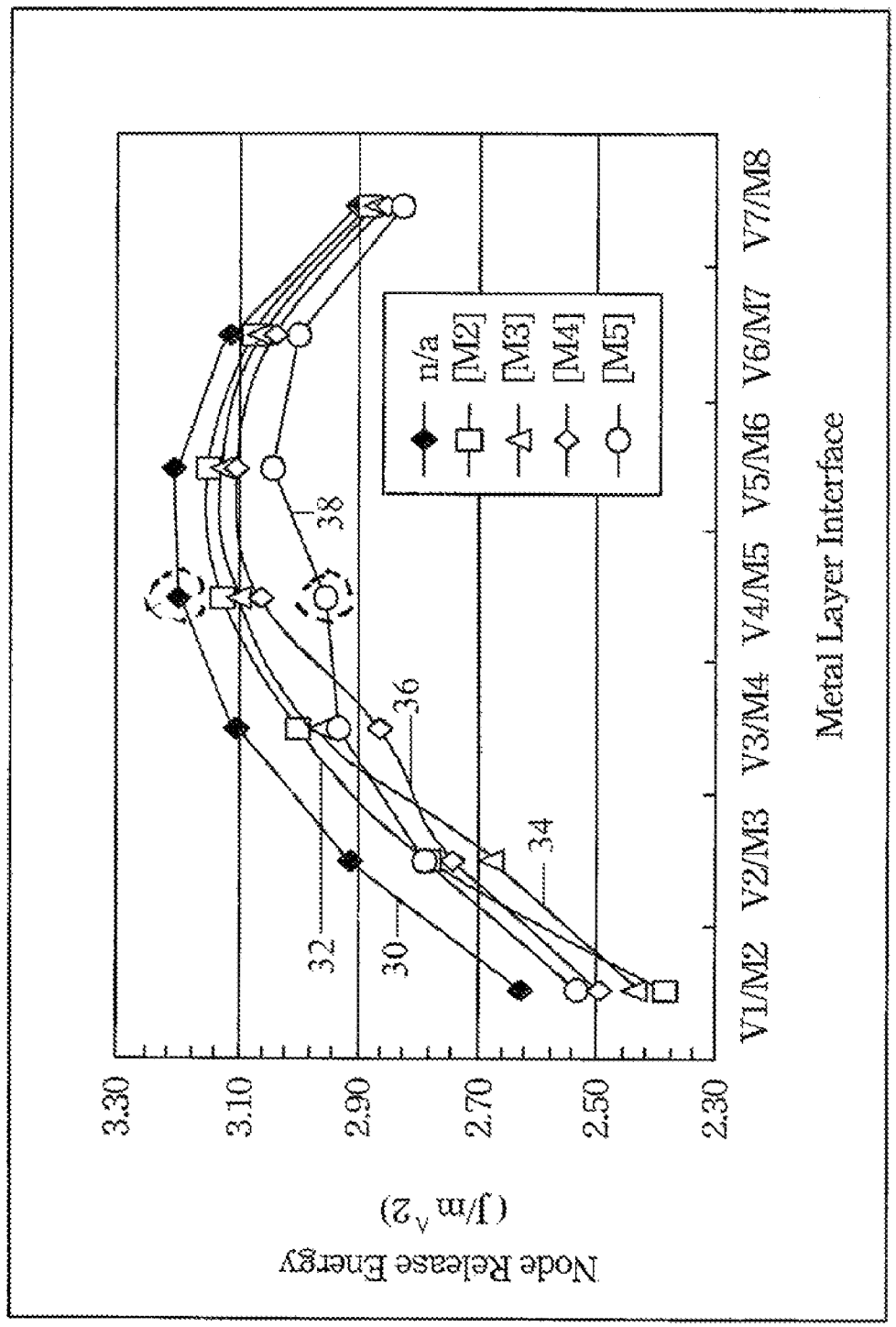
FIG. 3 illustrates the node release energies at different layers in interconnect structures.

The possibilities of peeling at different dielectric layers are different, and re-enforcing the layer having the greatest possibility of peeling is expected to have the best effect of improving the overall reliability of the entire semiconductor chip 10. Simulations were made to study the node release energies on each of the metallization layers M1 through M8, as shown in FIG. 3. It is expected that the layer having the greatest node release energy has the greatest possibility of peeling, and is preferably formed using stronger dielectric materials. In FIG. 3, the Y-axis indicates the node release energy, while the X-axis indicates the dielectric layers. Line 30 shows the node release energies of dielectric layers in a homogeneous interconnect structure, in which dielectric materials are all formed of a same XLK dielectric material having a k value of 2.0. Line 30 indicates that the greatest node release energy exists around the middle layers, particularly metallization layers M5 and M6. Lines 32, 34, 36, and 38 are the results obtained by replacing metallization layers (including the underlying via dielectric layer) M2, M3, M4, and M5 with a higher k dielectric material, respectively. It is noted that by replacing any of the dielectric layer with a higher k dielectric material, the node release energies in all of the dielectric layers are reduced. Among all the results, line 38 (which is the result of replacing dielectric layer 5) again has the best result, and not only all of the node release energies are reduced, the node release energy of metallization layer M5 is even reduced to lower than that of metallization layer M6.

Figure 4:
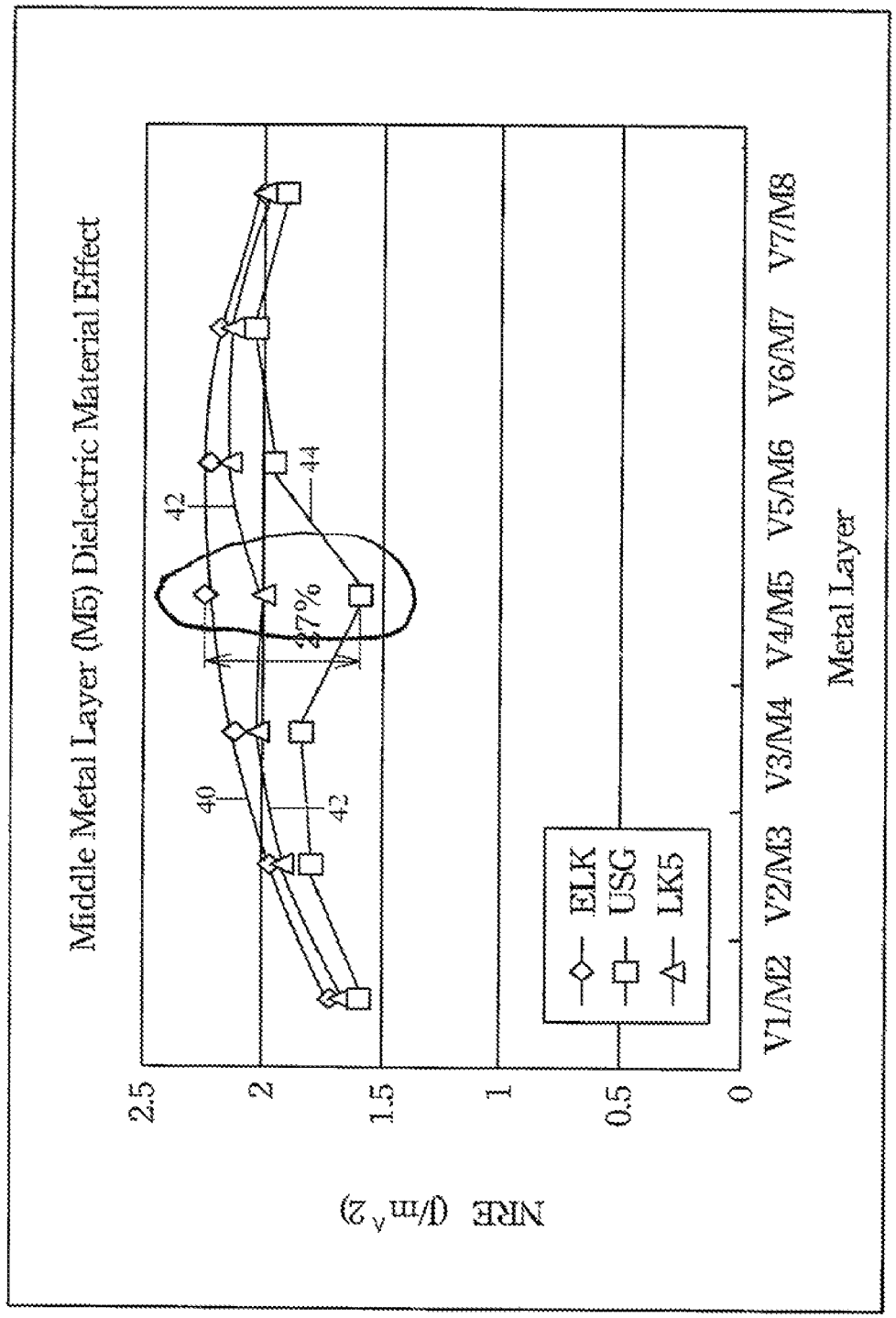
FIG. 4 illustrates the reductions of node release energies when dielectric materials having different k values are used to replace a middle layer of an interconnect structure.

FIG. 4 illustrates further simulation results showing how the material (and hence the mechanical strength) of the replaced layer to the overall reliability of metallization layers M1 through M8. Line 40 shows the node release energies of dielectric layers in a homogeneous interconnect structure, in which dielectric materials are all formed of a same ELK dielectric material having a k value of 2.0. Line 40 indicates that the greatest node release energy exists around the middle dielectric layer, particularly metallization layers M5 and M6. Lines 42 and 44 are the results obtained by replacing dielectric layer 5 (including the underlying via dielectric layer V4) with dielectric materials LK5 and USG, respectively. USG has a k value (and mechanical strength) higher than that of dielectric material LK5, which is further higher than that of the remaining dielectric layers 2 though 4 and 6 through 8. It is noted that release energies of line 44 are lower than that of line 42, which are further lower than that of line 40, indicating the reliability of semiconductor chip 10 will be improved more if the replacing material has a higher k value and a greater mechanical strength.

It is to be realized that replacing a dielectric layer with one having a higher k value will cause the RC delay of the interconnect structure to be increased. However, since metallization layer M5 has significantly lower metal line density and greater spacings than that of metallization layers 2 and 3, and possibly 4, the degradation in the RC delay is negligible. Overall, with both the reliability and the electrical performance taken into consideration, semiconductor chip 10 is significantly improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a first metallization layer comprising:
      a first dielectric layer having a first k value; and
      first metal lines in the first dielectric layer;
   a second metallization layer over the first metallization layer, the second metallization layer comprising:
      a second dielectric layer having a second k value greater than the first k value; and
      second metal lines in the second dielectric layer;
   a third metallization layer over the second metallization layer, the third metallization layer comprising:
      a third dielectric layer having a third k value equal to or less than the second k value; and
      third metal lines in the third dielectric layer; and
   a bottom passivation layer over the third metallization layer.

2. The integrated circuit structure of claim 1 further comprising:
   an additional metallization layer under the first metallization layer, wherein the additional metallization layer comprises:
      an additional dielectric layer having an additional k value greater than the first k value; and
      additional metal lines in the additional dielectric layer.

3. The integrated circuit structure of claim 1, wherein the second k value is greater than the first k value by greater than about 12%.

4. The integrated circuit structure of claim 1, wherein the second metallization layer is a middle metallization layer.

5. The integrated circuit structure of claim 1, wherein the second dielectric layer has a higher mechanical strength than the first dielectric layer.

6. An integrated circuit structure comprising:
   a semiconductor substrate;
   a passivation layer over the semiconductor substrate; and
   an interconnect structure between the semiconductor substrate and the passivation layer, wherein the interconnect structure comprises a plurality of metallization layers, each comprising a dielectric layer, and metal lines in the dielectric layer, and wherein the dielectric layers in the plurality of metallization layers comprise:
      a first group of dielectric layers having first k values;
      a second group of dielectric layers over the first group of dielectric layers,
         wherein the second group of dielectric layers have second k values different from the first k values;
      wherein the second group of dielectric layers include a middle dielectric layer having a middle dielectric layer k value greater than the first k values; and
         a third group of dielectric layers over the second group of dielectric layers and having third k values equal or less than the middle dielectric layer k value.

7. The integrated circuit structure of claim 6, wherein the dielectric layers in the plurality of metallization layers are formed of dielectric materials having k values no higher than k values of low-k dielectric materials.

8. The integrated circuit structure of claim 6, wherein the second group of dielectric layers are formed of extra low-k dielectric materials, and wherein at least one of the first and the third groups of dielectric layers are formed of ultra low-k dielectric materials.

9. The integrated circuit structure of claim 6, wherein the first group of dielectric layers further comprises a bottom metallization layer and a metallization layer immediately over the bottom metallization layer.

10. An integrated circuit structure comprising:
    a semiconductor substrate; and
    an interconnect structure overlying the semiconductor substrate, wherein the interconnect structure comprises at least about seven metallization layers comprising;
       a first metallization layer comprising:
          a first dielectric layer having a first k value; and
          first metal lines in the first dielectric layer;
       a second metallization layer over the first metallization layer, wherein the second metallization layer is in a middle position of the interconnect structure and comprises:
          a second dielectric layer having a second k value, wherein the second dielectric layer has a greater mechanical strength than the first dielectric layer; and
          second metal lines in the second dielectric layer; and
       a third metallization layer over the second metallization layer, the third metallization layer comprising:
          a third dielectric layer having a third k value equal or less than the second k value; and
          third metal lines in the third dielectric layer.

11. The integrated circuit structure of claim 10, wherein the second k value is greater than the first k value.

12. The integrated circuit structure of claim 10, wherein the second dielectric layer has a second hardness greater than a first hardness of the first dielectric layer by greater than about 70MPa.

13. The integrated circuit structure of claim 10 further comprising a bottom metallization layer underlying the first dielectric layer, wherein a dielectric layer in the bottom metallization layer has a mechanical strength substantially close to the mechanical strength of the second dielectric layer.

* * * * *